(12) United States Patent
Yamaoka et al.

(10) Patent No.: US 11,855,410 B2
(45) Date of Patent: Dec. 26, 2023

(54) SEMICONDUCTOR OPTICAL MODULE (71) Applicant: Nippon Telegraph and Telephone Corporation, Tokyo (JP)

(72) Inventors: Suguru Yamaoka, Musashino (JP); Ryo Nakao, Musashino (JP); Takaaki Kakitsuka, Musashino (JP); Shinji Matsuo, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 617 days.

(21) Appl. No.: 17/058,007

(22) PCT Filed: May 15, 2019

(86) PCT No.: PCT/JP2019/019382
§ 371 (c)(1),
(2) Date: Nov. 23, 2020

(87) PCT Pub. No.: WO2019/225447
PCT Pub. Date: Nov. 28, 2019

(65) Prior Publication Data
US 2021/0203125 A1    Jul. 1, 2021

(30) Foreign Application Priority Data

May 24, 2018  (JP) ................................ 2018-099949

(51) Int. Cl.
*H01S 5/026*  (2006.01)
*H01S 5/10*   (2021.01)

(52) U.S. Cl.
CPC ............ *H01S 5/026* (2013.01); *H01S 5/1014* (2013.01)

(58) Field of Classification Search
CPC ...................................................... H01S 5/3214
(Continued)

(56) References Cited

U.S. PATENT DOCUMENTS

2014/0321488 A1*  10/2014  Chen ................... H01S 5/02461
                                                              438/694

FOREIGN PATENT DOCUMENTS

| JP | H05-327127 A | 12/1993 |
| JP | 2013-26254 A | 2/2013 |

(Continued)

OTHER PUBLICATIONS

International Search Report dated Jul. 9, 2019, issued in PCT Application No. PCT/JP2019/019382, filed May 15, 2019.
(Continued)

*Primary Examiner* — Tuan N Nguyen
(74) *Attorney, Agent, or Firm* — Workman Nydegger (57) ABSTRACT

A semiconductor optical module includes a semiconductor laser element region having an active layer, a first cladding layer which is formed such that the active layer is embedded therein, a second cladding layer which is formed underneath the active layer and the first cladding layer, and a heater unit which produces a temperature change in a waveguide; an optical waveguide element region including a spot-size converter which converts a spot size of incident laser light, and an optical waveguide core layer which is formed such that the spot-size converter is embedded therein, the first cladding layer contains InP, the second cladding layer is made of a material lower in refractive index and higher in thermal conductivity than the first cladding layer, and a third cladding layer which is made of a material lower in refractive index and lower in thermal conductivity than the second cladding layer is formed underneath the spot-size converter and the heater unit.

11 Claims, 9 Drawing Sheets

(58) Field of Classification Search
USPC .................................................. 372/45.01
See application file for complete search history.

(56) References Cited

FOREIGN PATENT DOCUMENTS

JP          2014-192247 A       10/2014
JP          2016-156933 A        9/2016

OTHER PUBLICATIONS

W. Kobayashi, et al., *50 GB/s Direct Modulation of a 1.3-μm InGaAlAs—Based DFB Laser with a Ridge Waveguide Structure*, IEEE Journal of Selected Topics in Quantum Electronics, Vo. 19, No. 4, 2013, pp. 1-8.

T. Fujii et al., *Epitaxial Growth of InP to Bury Directly Bonded Thin Active Layer on SiO$_2$/Si Substrate for Fabricating Distributed Feedback lasers on Silicon*, IET Optoelectronics, vol. 9, Iss. 4, 2015, pp. 151-157.

S. Tsuji et al., *InGaAsP/InP Laser Diodes Mounted on Semi-Insulating SiC Ceramics*, Jpn. J. Appl. Phys., vol. 22, 1983, pp. 239-242.

J. A. Alamo et al., *Rapid Thermal Annealing of InP Using GaAs and InP Proximity Caps*, J. Appl. Phys, vol. 62, 1987, pp. 3456-3458.

H. Nishi et al., *Membrane Distributed-Reflector Laser Integrated with SiO$_x$-Based Spot-Size Converter on Si Substrate*, Optics Express, Vo. 24, No. 16, 2016, pp. 18346-18352.

H. Nishi et al., *SiOxNy Back-End Integration Technologies for Heterogeneously Integrated Si Platform*, ECS Transaction, vol. 74, No. 8, 2016, pp.

\* cited by examiner

SEMICONDUCTOR OPTICAL MODULE

TECHNICAL FIELD

The present invention relates to a semiconductor optical module formed by integrating a semiconductor laser and an optical waveguide and, more particularly, to a semiconductor optical module capable of simultaneously achieving improvement in properties of a semiconductor laser, improvement in efficiency of coupling laser light to an optical fiber, and reduction in power consumption.

BACKGROUND ART

Semiconductor elements are widely prevalent as small and low-power-consumption elements. Among others, semiconductor optical modules including a semiconductor laser are each an important constituent component of an information communication system.

A compound semiconductor, typified by InP, GaAs, or the like, is used as a material for a semiconductor optical module which performs light emission, light reception, and optical modulation. However, since the materials are not good in thermal conductivity, an element increases in temperature during operation and is limited in properties (see, for example, Non-Patent Literature 1).

Si that is widely used as a material for a semiconductor electronic device has higher thermal conductivity than a compound semiconductor, such as InP or GaAs. Si, however, is an indirect bandgap semiconductor and has very low emission efficiency. It is extremely difficult to use Si as a material for an active layer (core) of a semiconductor optical module. Additionally, Si is higher in refractive index than InP and GaAs and cannot be used as a material for a cladding layer from the viewpoint of optical confinement, and needs to keep enough distance from an active layer made of, e.g., InP or GaAs with a cladding layer between itself and the active layer. For this reason, it is also difficult to use Si as a cladding material of a semiconductor optical module.

In the case of an InP-based optical element composed of an active layer of, e.g., InGaAsP or InGaAlAs and a cladding layer of, e.g., InP, a difference in refractive index between the active layer and the cladding layer, which is required for optical confinement, cannot be made wide, and there is a limit to improvement in device properties.

As measures to achieve a wide difference in refractive index between an active layer and a cladding layer in an InP-based optical element, adoption of air or an insulating film low in refractive index as a material for a cladding layer in a semiconductor laser has been proposed (see, for example, Non-Patent Literature 2). Non-Patent Literature 2 realizes a semiconductor laser in which a region with a small injection of current, i.e., a small temperature increase has significantly increased element properties. However, use of an insulating material low in thermal conductivity, such as air, as a material for a cladding layer degrades heat dissipation properties and promotes a temperature increase, which results in a noticeable degradation in properties due to heat.

A metal material is conceivable as a material high in thermal conductivity. For example, gold (Au) is higher in thermal conductivity and much lower in refractive index but is higher in extinction coefficient than Si, which leads to a large optical absorption loss. If gold is used as a material for a cladding layer, optical confinement to a waveguide cannot be realized. For this reason, a material low in extinction coefficient at an operating wavelength of an optical element needs to be used as a material for a cladding layer.

In the case of an optical element in which current is injected or an electric field is applied in a substrate planar direction, since a conductive material, such as metal, functions as a bypass for carriers, current injection and electric field application cannot be performed using a conductive material, such as metal. For this reason, for efficient current injection or electric field application in a substrate planar direction, a material for a cladding layer needs to be a material which has a wider bandgap than a core layer, a p-type semiconductor layer, and an n-type semiconductor layer and functions as a barrier against carriers in an optical element.

Due to the above-described problems, a structure which achieves both close optical confinement and high thermal conductivity and is capable of efficiently injecting current into or applying an electric field to an active layer has not been realized so far in an InP-based optical element.

Under the above-described circumstances, use of SiC or diamond (C) that is relatively low in refractive index and is very high in thermal conductivity as a material for a cladding layer in a semiconductor laser element region is being considered. This is because use of SiC or C as a material for a cladding layer in an active layer allows efficient current injection or electric field application in a substrate planar direction and achieves close optical confinement and a heat dissipation effect in an active layer.

In practical use of a semiconductor laser, it is important to couple laser light to an optical fiber and guide laser light through the optical fiber. Generally, a mode radius of a semiconductor laser differs greatly from that of an optical fiber, and a refractive index of a waveguide of the semiconductor laser is also different from that of the optical fiber. For this reason, laser light cannot be guided with high efficiency simply by causing a semiconductor laser and an optical fiber to butt against each other.

As a method for coupling laser light to an optical fiber with high efficiency, there is available a method that spatially couples laser light to an optical fiber using a lens. Such a method using a lens for wave guiding is simple in configuration but needs to use large space. Thus, miniaturization and integration is difficult.

As another method for coupling laser light to an optical fiber with high efficiency, there is available a method using a spot-size converter (SSC) to couple laser light to an optical fiber. An SSC has an optical waveguide of an optical element formed, for example, in a tapered shape at a coupling portion between the optical waveguide and an optical fiber and is thus capable of converting a beam diameter (spot size) of laser light and coupling the laser light to the optical fiber. In a case using an SSC, laser light can be coupled to an optical fiber with high efficiency without use of large space as in a case using a lens. It is thus important to integrate an SSC together with a semiconductor laser.

To eliminate a difference in refractive index from an optical fiber, an SSC needs to be made of a material having a refractive index comparable to that of the optical fiber. For example, the method described in Non-Patent Literature 5 eliminates a difference in refractive index while bringing a mode radius from a mode radius of a semiconductor laser produced on $SiO_2$ having a refractive index substantially comparable to glass close to a mode radius of a glass-based optical fiber using an SSC composed of a waveguide bearing an SiO$_2$ overcladding, in order to couple laser light to the optical fiber, and realizes high-efficient optical coupling.

CITATION LIST

Non-Patent Literature

Non-Patent Literature 1: W. Kobayashi, T. Ito, T. Yamanaka, T. Fujisawa, Y. Shibata, T. Kurosaki, M. Kohtoku, T. Tadokoro, and H. Sanjoh, "50-Gb/s direct modulation of a 1.3-μm InGaAlAs-based DFB laser with a ridge waveguide structure," IEEE J. Sel. Top. Quantum Electron., vol. 19, no. 4, pp. 1500908-1500908, July 2013

Non-Patent Literature 2: T. Fujii, T. Sato, K. Takeda, K. Hasebe, T. Kakitsuka, and S. Matsuo, "Epitaxial growth of InP to bury directly bonded thin active layer on SiO2/Si substrate for fabricating distributed feedback lasers on silicon," IET Optoelectron., vol. 9, no. 4, pp. 151-157, August 2015

Non-Patent Literature 3: S. Tsuji, K. Mizuishi, Y. Nakayama, M. Shimaoka, and M. Hirao, "InGaAsP/InP Laser Diodes Mounted on Semi-Insulating SiC Ceramics," Jpn. J. Appl. Phys., vol. 22, no. S1, p. 239, January 1983

Non-Patent Literature 4: J. A. Alamo, T. Mizutani, J. A. Alamo, and T. Mizutani, "Rapid thermal annealing of InP using GaAs and InP proximity caps," J. Appl. Phys., vol. 62, pp. 3456-3458, 1987

Non-Patent Literature 5: H. Nishi, T. Fujii, K. Takeda, K. Hasebe, T. Kakitsuka, T. Tsuchizawa, T. Yamamoto, K. Yamada, and S. Matsuo, "Membrane distributed-reflector laser integrated with SiOx-based spot-size converter on Si substrate," Opt. Express, vol. 24, no. 16, pp. 18346-18352, August 2016

SUMMARY OF THE INVENTION

Technical Problem

As described above, if not SiO$_2$ but SiC or C higher in thermal conductivity is used as a cladding material to improve properties of a semiconductor laser, the properties of the semiconductor laser can be improved with improvement in heat dissipation. Although refractive indexes of SiC and C are lower than a refractive index of an active layer but are higher than a refractive index of a material for an SSC or an optical fiber, such as SiO$_2$. For this reason, for example, if an SSC is formed using an SiO$_2$ overcladding and an SiC undercladding, since the SSC is configured such that a waveguide width decreases gradually, radiation may be emitted to the SiC undercladding along with propagation through a waveguide in a waveguide mode. Thus, sufficient efficiency of coupling laser light to an optical fiber cannot be obtained simply by using SiC for an undercladding.

Additionally, in an optical waveguide element which performs wavelength adjustment and the like by varying a refractive index of an optical waveguide using a thermoregulator, such as a heater, in a waveguide region, high thermal conductivity of SiC reduces temperature changes, and heat capacity of the element is extremely low. This poses the problem of increase in power consumption required to obtain a desired temperature change.

As is seen from the above, if SiC is simply used as a cladding material, improvement in properties can be expected in a semiconductor laser portion while it is very difficult to achieve light extraction from an active layer region and increase in efficiency of power usage of a temperature-controlled optical element. A solution to the problem has not been reported so far.

The present invention has been made to solve the above-described problems, and has as its object to provide a semiconductor optical module capable of simultaneously achieving improvement in properties of a semiconductor laser, improvement in efficiency of coupling laser light to an optical fiber, and reduction in power consumption.

Means for Solving the Problem

A semiconductor optical module according to one aspect of the present invention is a semiconductor optical module formed by integrating an optical waveguide element region and a semiconductor laser element region, wherein the semiconductor laser element region includes an active layer, a first cladding layer which is formed such that the active layer is embedded in the first cladding layer, a second cladding layer which is formed underneath the active layer and the first cladding layer, and a heater unit which produces a temperature change in a waveguide in the semiconductor laser element region, the optical waveguide element region includes a spot-size converter on which laser light emitted from the semiconductor laser element region is incident and which is composed of a tapered waveguide so as to convert a spot size of the incident laser light, and an optical waveguide core layer which is formed such that the spot-size converter is embedded in the optical waveguide core layer, the first cladding layer contains InP, the second cladding layer is made of a material lower in refractive index and higher in thermal conductivity than the first cladding layer, and a third cladding layer which is made of a material lower in refractive index and lower in thermal conductivity than the second cladding layer is formed underneath the spot-size converter and the heater unit.

In a semiconductor optical module according to another aspect of the present invention, the second cladding layer contains SiC or C.

In a semiconductor optical module according to another aspect of the present invention, the tapered waveguide of the spot-size converter contains InP.

In a semiconductor optical module according to another aspect of the present invention, the third cladding layer contains any of SiN, SiO$_2$, SiO$_x$, SiON, and Al$_2$O$_3$.

A semiconductor optical module according to another aspect of the present invention further includes a fourth cladding layer which is an upper cladding layer in the optical waveguide element region and the semiconductor laser element region, and the fourth cladding layer contains any of SiN, SiO$_2$, SiO$_x$, SiON, and Al$_2$O$_3$.

Effects of the Invention

A semiconductor optical module according to one embodiment of the present invention is capable of simultaneously achieving improvement in properties of a semiconductor laser, improvement in efficiency of coupling laser light to an optical fiber, and reduction in power consumption.

BRIEF DESCRIPTION OF DRAWINGS

FIG. 1(*a*) is a top view of a configuration of a semiconductor optical module according to one embodiment of the present invention, and FIG. 1(*b*) is a cross-sectional view of the semiconductor optical module according to the one embodiment of the present invention taken along line IB-IB.

DESCRIPTION OF EMBODIMENTS

Figure 1:
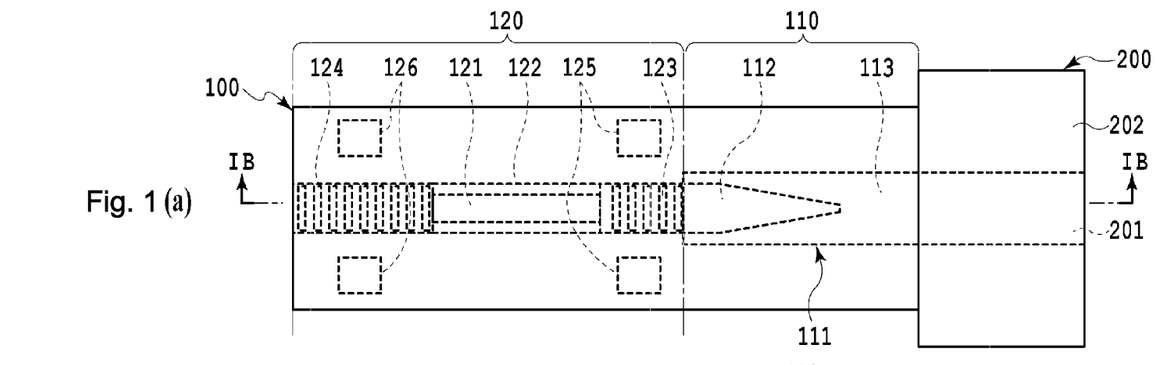

FIG. 1(a) is a top view of a semiconductor optical module according to one embodiment of the present invention. A semiconductor optical module 100 according to the one embodiment of the present invention and an optical fiber 200 which is coupled to the semiconductor optical module 100 are shown in FIG. 1(a).

FIG. 1(b) is a cross-sectional view of the semiconductor optical module according to the one embodiment of the present invention taken along line IB-IB. As shown in FIGS. 1(a) and 1(b), the semiconductor optical module 100 are formed by integrating an optical waveguide element region 110 which is optically coupled to the optical fiber 200 and a semiconductor laser element region 120 which makes laser light incident on the optical waveguide element region 110. The optical fiber 200 includes a fiber core 201 and a fiber cladding 202.

As shown in FIG. 1(a), the optical waveguide element region 110 includes a waveguide unit 111 which has an SSC unit 112 and a waveguide core layer 113 formed such that the SSC unit 112 is embedded therein. The semiconductor laser element region 120 includes an active layer 121, a first cladding layer 122 which contains InP, a preceding-stage distributed Bragg reflector (DBR) unit 123 which is formed at a preceding stage of the active layer 121, a subsequent-stage DBR unit 124 which is formed at a subsequent stage of the active layer 121, and heater units 125 and 126 for performing wavelength adjustment by varying a refractive index of an optical waveguide through temperature adjustment.

As shown in FIG. 1(b), in the semiconductor optical module according to the one embodiment of the present invention, a second cladding layer 152, a third cladding layer 153 in which the second cladding layer 152 is embedded, the waveguide unit 111, the active layer 121, and the preceding-stage DBR unit 123 and subsequent-stage DBR unit 124 on the third cladding layer 153, and a fourth cladding layer 154 in which the waveguide unit 111, the active layer 121, and the preceding-stage DBR unit 123 and subsequent-stage DBR unit 124 are embedded are formed on a substrate 151.

Laser light emitted from the semiconductor laser element region 120 is incident on the SSC unit 112, and the SSC unit 112 is composed of a tapered waveguide so as to convert a spot size of the incident laser light. The SSC unit 112 can be made of, for example, InP. The waveguide core layer 113 is configured such that the SSC unit 112 is embedded therein. Although $SiO_x$ can be used as a material for the waveguide core layer 113, materials other than $SiO_x$, such as SiN, $SiO_2$, SiON, and $Al_2O_3$, are conceivable as the material. A waveguide mode of light can be guided from the waveguide in the SSC unit 112 to the waveguide core layer 113 by stepwise narrowing a width of the waveguide in the SSC unit 112 as in a taper.

The active layer 121 includes multiquantum well and barrier layers which are made of InGaAlAs with different compositions. Note that although InGaAs, InGaAsP, and the like are conceivable as a material for the multiquantum well and barrier layers in the active layer 121 in addition to InGaAlAs, the material is not limited to these.

The first cladding layer 122 is formed such that the active layer 121 is embedded therein. The first cladding layer 122 on the multiquantum well and barrier layers of the active layer 121 can be made of i-InP, the first cladding layer 122 on a side with one side surface of the active layer 121 can be made of p-InP, and the first cladding layer 122 on a side with the other side surface of the active layer 121 can be made of n-InP.

For example, a width of the active layer 121 can be set at 0.6 μm, and thicknesses of the active layer 121 and the first cladding layer 122 can be set at 0.32 μm. A layer structure and a waveguide width, however, are not limited to the above-described ones. The thickness of 0.32 μm of the active layer 121 is approximately an upper limit of a range within which light of a wavelength of 1.31 μm which is to propagate through the active layer 121 propagates in a single mode with respect to a thickness direction of the active layer 121.

Assume a case where an operating wavelength and a material used for the active layer 121 are changed. Letting λ be the operating wavelength, $n_{core}$ be an average refractive index of the active layer 121, and $n_{clad}$ be a refractive index of the second cladding layer 152, a thickness t of the active layer 121 may approximately satisfy the relationship indicated by Formula (1) below to achieve the single mode in the thickness direction of the active layer 121.

Formula 1

$$t < \frac{3}{2\pi} \frac{\lambda}{\sqrt{n_{core}^2 - n_{clad}^2}} \quad (1)$$

For example, to use light of a wavelength in the 1.55 μm band, the thickness t of the core layer is set at 0.364 μm or less.

The preceding-stage DBR unit 123 and subsequent-stage DBR unit 124 can be made of, for example, InP formed in a diffraction grating shape. The heater units 125 and 126 for temperature adjustment are provided on two sides of the preceding-stage DBR unit 123 and subsequent-stage DBR unit 124. The heater units 125 and 126 can vary operating wavelengths of the preceding-stage DBR unit 123 and subsequent-stage DBR unit 124 by producing a temperature change in a waveguide of the semiconductor laser element region 120 through power injection and varying a refractive index of light in the waveguide to vary a wavelength of light propagating through the waveguide. The heater units 125 and 126 can be made of tantalum (Ta). A material, a temperature adjustment method, and installation positions for the heater units 125 and 126, however, are not limited to the above-described ones.

The second cladding layer 152 is a lower cladding layer which is formed underneath the active layer 121 and the first cladding layer. The second cladding layer 152 contains a material (e.g., SiC or C) lower in refractive index and higher in thermal conductivity than that for the first cladding layer 122. SiC and C are lower in refractive index, higher in thermal conductivity, and wider in bandgap than any material, of which the active layer 121 is formed. Although the second cladding layer 152 can be produced by lithographic etching and the like of the substrate 151 made of, e.g., SiC or C, any production method may be adopted.

The third cladding layer 153 is a lower cladding layer which is formed underneath the SSC unit 112, the preceding-stage DBR unit 123, and the subsequent-stage DBR unit 124. A material lower in refractive index and lower in thermal conductivity than the second cladding layer 152, such as $SiO_2$, can be used for the third cladding layer 153. Note that a material for the third cladding layer 153 is not limited to $SiO_2$ and that, for example, SiN, $SiO_x$, SiON, or $Al_2O_3$ may be used. Although the third cladding layer 153 can be produced by material deposition, planarization polishing, and the like, any production method may be adopted.

The fourth cladding layer 154 is an upper cladding layer in the optical waveguide element region 110 and the semiconductor laser element region 120. For example, $SiO_2$ can be used for the fourth cladding layer 154. $SiO_2$ has a refractive index comparable to a quartz optical fiber cladding layer which is generally used for the optical fiber 200. Note that a material for the fourth cladding layer 154 is not limited to $SiO_2$ and that, for example, SiN, $SiO_x$, SiON, or $Al_2O_3$ may be used. Although the fourth cladding layer 154 can be produced by material deposition, planarization polishing, and the like, any production method may be adopted.

In the semiconductor optical module according to the one embodiment of the present invention, although the active layer 121 and the first cladding layer 122 can be formed by a crystal growth technique, and the second cladding layer 152 can be formed by a technique for substrate bonding to the active layer 121 or the like, production methods are not limited to these. Additionally, optical confinement in a substrate horizontal direction is realized by a difference in refractive index between the multiquantum well layers and the first cladding layer 122 and a waveguide gain. Any realization method, such as optical confinement by a two-dimensional photonic crystal structure, may be adopted.

(Reference Example)

For comparison with the present invention, a case where a lower cladding layer (the third cladding layer 153) made of, e.g., $SiO_2$ is replaced with a lower cladding layer made of SiC in the optical waveguide element region 110 of the semiconductor optical module according to the one embodiment of the present invention will be considered as a reference example.

Figure 2:
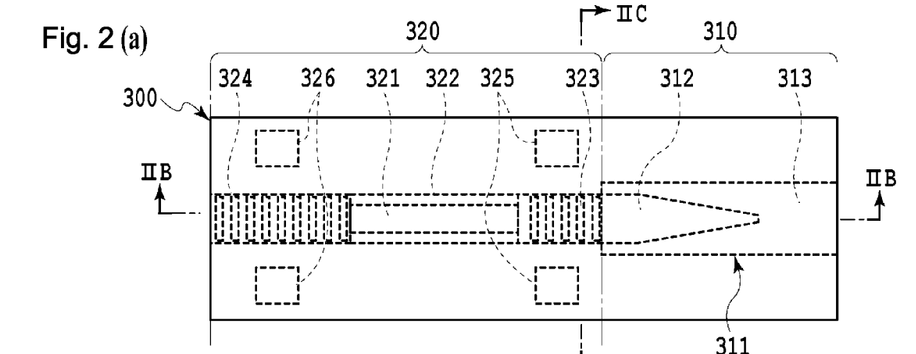
FIG. 2(a) is a top view of a semiconductor optical module according to a reference example.
FIG. 2(b) is a cross-sectional view of the semiconductor optical module according to the reference example taken along line IIB-IIB.
FIG. 2(c) is a cross-sectional view of the semiconductor optical module according to the reference example taken along line IIC-IIC.

FIG. 2(a) is a top view of a semiconductor optical module according to the reference example. FIG. 2(b) is a cross-sectional view of the semiconductor optical module according to the reference example taken along line IIB-IIB. A semiconductor optical module 300 which includes an optical waveguide element region 310 and a semiconductor laser element region 320 is shown in FIGS. 2(a) and 2(b).

As shown in FIGS. 2(a) and 2(b), the optical waveguide element region 310 includes a waveguide unit 311 which has an SSC unit 312 composed of a tapered waveguide and a waveguide core layer 313. The semiconductor laser element region 320 includes an active layer 321, a first cladding layer 322 which contains InP, a preceding-stage DBR unit 323 and a subsequent-stage DBR unit 324, and heater units 325 and 326.

As shown in FIG. 2(b), in the semiconductor optical module 300 according to the reference example, a lower cladding layer 352, the waveguide unit 311, the active layer 321, and the preceding-stage DBR unit 323 and subsequent-stage DBR unit 324 on the lower cladding layer 352, and an upper cladding layer 354 in which the waveguide unit 311, the active layer 321, and the preceding-stage DBR unit 323 and subsequent-stage DBR unit 324 are embedded are formed on a substrate 351.

FIG. 2(c) is a cross-sectional view of the semiconductor optical module according to the reference example taken along line IIC-IIC. As shown in FIG. 2(c), the lower cladding layer 352 is made of SiC. The semiconductor optical module according to the reference example is identical in configuration to the semiconductor optical module according to the one embodiment of the present invention except that lower claddings in the optical waveguide element region 310 and the semiconductor laser element region 320 are both made of SiC.

Figure 3A:
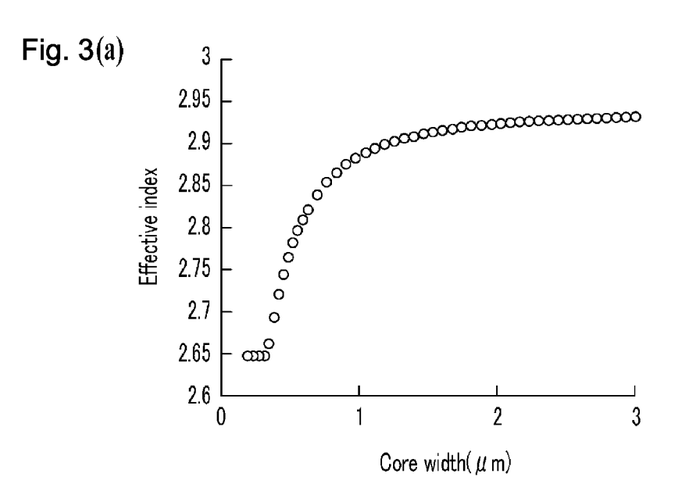
FIG. 3(a) is a graph showing waveguide width dependence of an equivalent refractive index in a dominant mode in an optical waveguide element region of the semiconductor optical module according to the reference example.
Figure 3B:
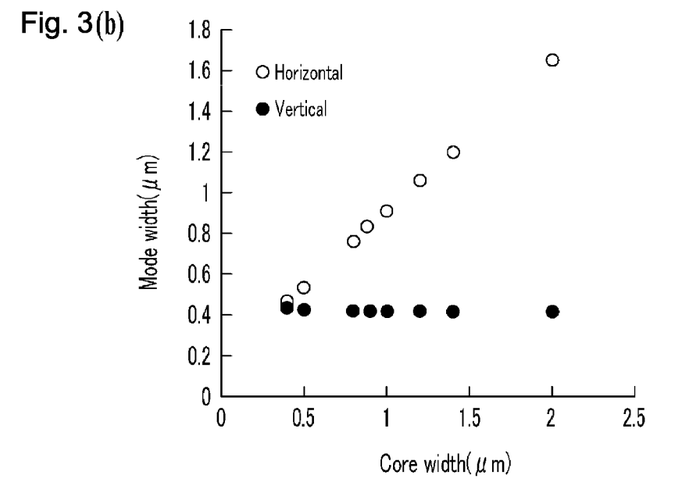
FIG. 3(b) is a graph showing waveguide width dependence of the spread of a dominant mode distribution in the optical waveguide element region of the semiconductor optical module according to the reference example.

FIG. 3(a) shows waveguide width dependence of an equivalent refractive index in a dominant mode in the optical waveguide element region of the semiconductor optical module according to the reference example, and FIG. 3(b) shows waveguide width dependence of the spread of a dominant mode distribution in the optical waveguide element region of the semiconductor optical module according to the reference example. In the semiconductor optical module according to the reference example, InP was used for the SSC unit 312 and the preceding-stage DBR unit 323 and subsequent-stage DBR unit 324, SiC was used for the substrate 351 and the lower cladding layer 352, $SiO_2$ was used for the upper cladding layer 354, and $SiO_x$ was used for the waveguide core layer 313. The active layer 321 was configured as multiquantum well and barrier layers which were made of InGaAlAs with different compositions, and the first cladding layer 322 was formed so as to cover an upper surface of the active layer 321 with i-InP and two side surfaces of the active layer 321 with p-InP and n-InP, respectively. In the semiconductor optical module according to the reference example, a width of the waveguide core layer 313 was set at 1.5 µm, a thickness of the SSC unit 312 was set at 0.32 µm, and a length of the tapered waveguide portion in the SSC unit 312 was set at 300 µm.

If a waveguide width in the SSC unit 312 is not more than 0.3 µm, as shown in FIG. 3(a), since an equivalent refractive index in a waveguide mode is not more than a refractive index of SiC, of which the lower cladding layer 352 is made, light propagates in a substrate radiation mode. As shown in FIG. 3(b), in a region with a narrow waveguide width, a mode diameter in a vertical direction does not expand at all. In a region with a wide waveguide width, a mode diameter in a horizontal direction expands, but light may be guided in multiple modes. For this reason, if SiC is simply used for a lower cladding, an SSC does not function at all.

Figure 4:
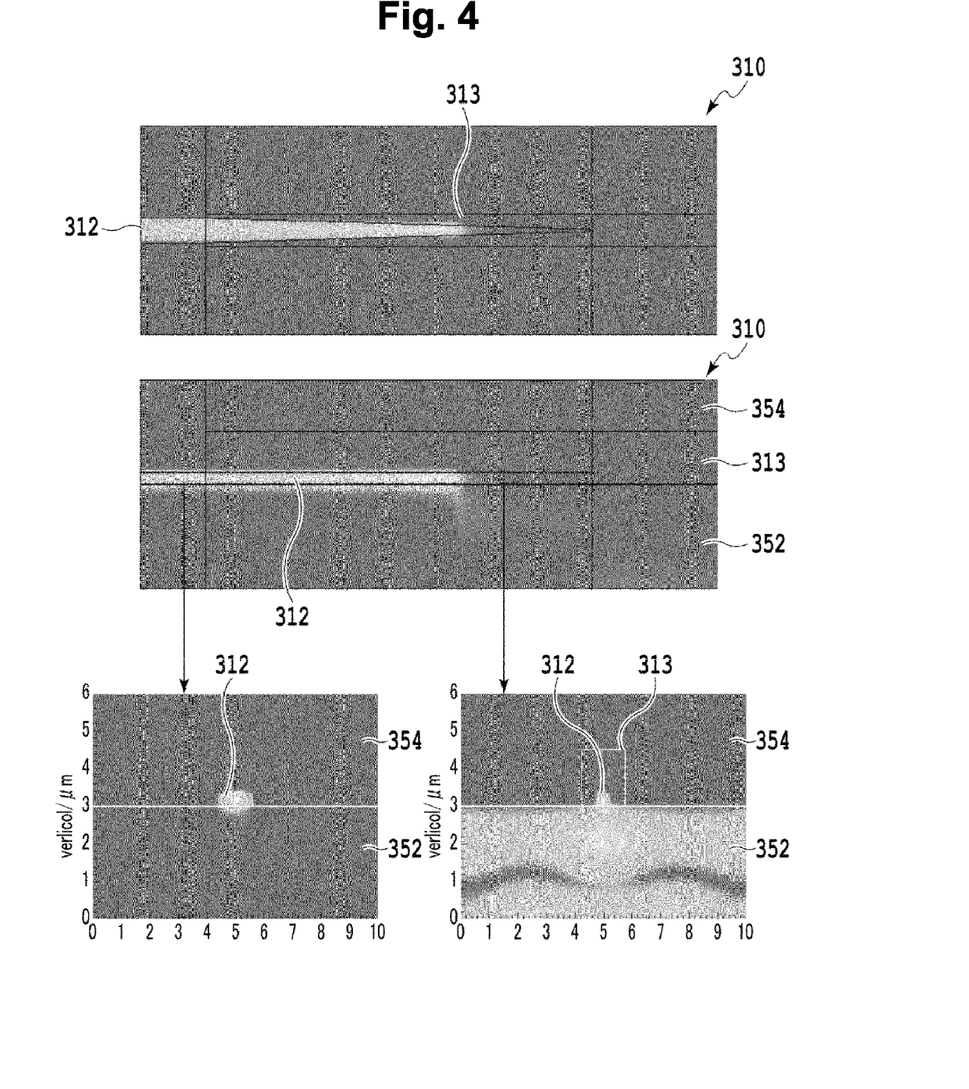
FIG. 4 is a chart showing a waveguide mode distribution in an optical waveguide element region 310 calculated on the basis of the semiconductor optical module according to the reference example.

FIG. 4 shows a waveguide mode distribution in the optical waveguide element region 310 which was calculated on the basis of the semiconductor optical module according to the reference example. As shown in FIG. 4, light incident on the SSC unit 312 of the optical waveguide element region 310 shifts to the substrate radiation mode in the middle of being guided and leaks from the SSC unit 312 into the substrate 351. Light cannot be guided to an output end at which the tapered portion of the SSC unit 312 terminates.

EXAMPLE

To demonstrate effects of the present invention, a semiconductor optical module according to an example of the present invention will be considered. In the semiconductor optical module according to the example of the present invention, InP was used for an SSC unit 112, a preceding-stage DBR unit 123, and a subsequent-stage DBR unit 124, SiC was used for a substrate 151 and a second cladding layer 152, $SiO_2$ was used for a third cladding layer 153 and a fourth cladding layer 154, and $SiO_x$ was used for a waveguide core layer 113. An active layer 121 was configured as multiquantum well and barrier layers which were made of InGaAlAs with different compositions, and a first cladding layer 122 was formed so as to cover an upper surface of the active layer 121 with i-InP and two side surfaces of the active layer 121 with p-InP and n-InP, respectively. In the semiconductor optical module according to the present example, a width of the waveguide core layer 113 was set at 1.5 µm, a thickness of the SSC unit 112 was set at 0.32 µm, and a length of a tapered waveguide portion in the SSC unit 112 was set at 300 µm.

Figure 5:
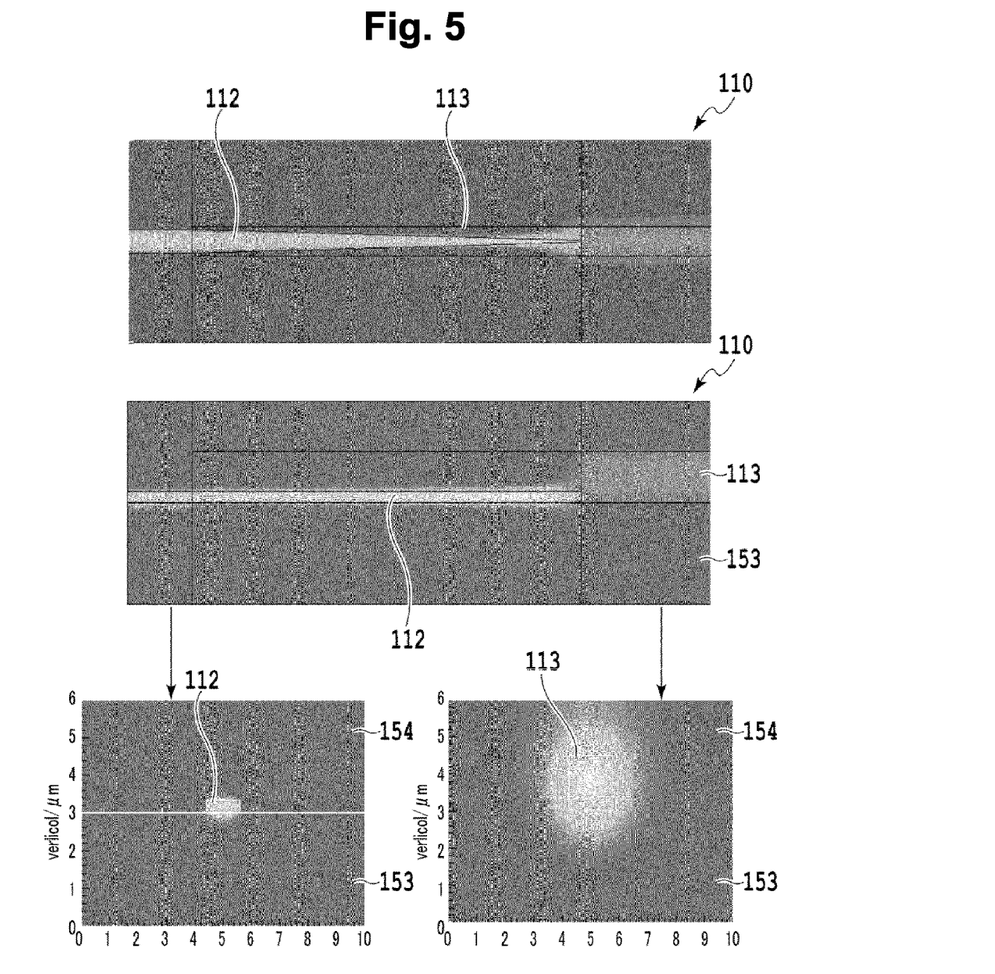
FIG. 5 is a chart showing a waveguide mode distribution in an optical waveguide element region 110 calculated on the basis of a semiconductor optical module according to an example of the present invention.

FIG. 5 shows a waveguide mode distribution in an optical waveguide element region 110 which was calculated on the basis of the semiconductor optical module according to the example of the present invention. As shown in FIG. 5, light propagates through the SSC unit 112 while gradually expanding a mode diameter, and a mode shifts to the waveguide core layer 113. This indicates that the introduction of the structure using $SiO_2$ for a lower cladding layer of the optical waveguide element region 110 reduced asymmetry in refractive index. Since a structure according to the one embodiment of the present invention as illustrated in the present example functions as an SSC, it can be concluded that the present invention provides very effective means in terms of integration of a laser on SiC and a waveguide structure. Thus, adoption of a structure of the present invention allows sufficient coupling of laser light to an optical fiber.

Since $SiO_x$ is used for the waveguide core layer 113 in the semiconductor optical module according to the present example, a refractive index of a waveguide end face in the optical waveguide element region 110 is almost equal to a refractive index of a quartz optical fiber. It is thus possible to inhibit reflection at an interface in a case where the semiconductor optical module is connected to an optical fiber 200 made of quartz.

Figure 6:
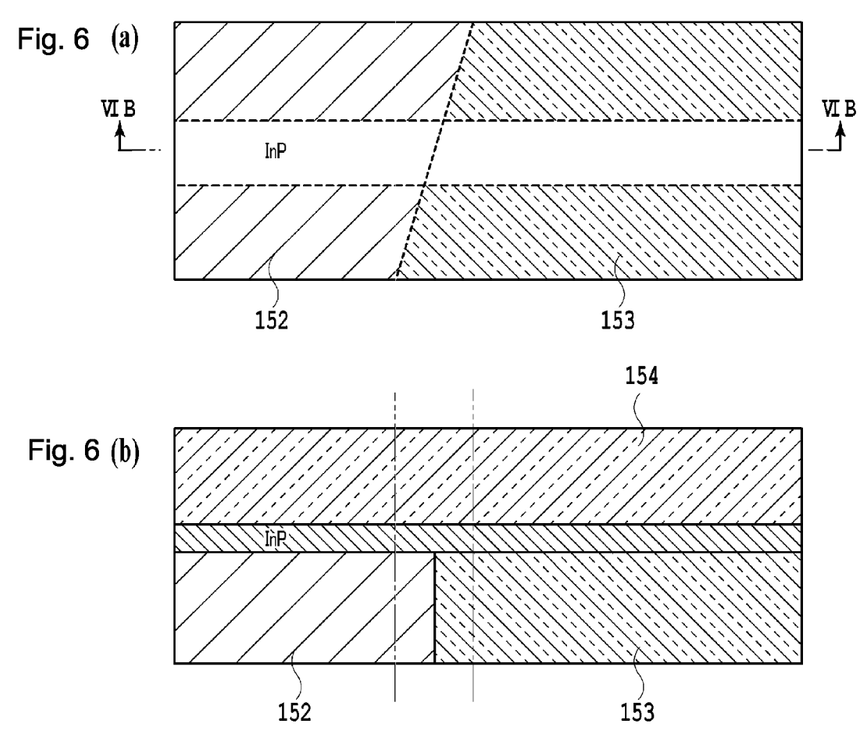
FIG. 6(a) is a top view showing an example of a structure of a connecting portion between a second cladding layer 152 and a third cladding layer 153 in the semiconductor optical module according to the one embodiment of the present invention.
FIG. 6(b) is a cross-sectional view taken along line VIB-VIB in FIG. 6(a).

FIGS. 6(a) and 6(b) are a top view showing an example of a structure of a connecting portion between the second cladding layer 152 and the third cladding layer 153 in the semiconductor optical module according to the one embodiment of the present invention and a cross-sectional view of FIG. 6(a) taken along line VIB-VIB. The DRB units 123 and 124, and the heater units 125 and 126 are not shown in FIG. 6(a) for the sake of simplicity.

By forming an end face of the connecting portion between the second cladding layer 152 and the third cladding layer 153 to be oblique to a plane orthogonal to a traveling direction of light, as shown in FIG. 6(a), reflection of light at the connecting end face between the second cladding layer 152 and the third cladding layer 153 toward the active layer 121 can be reduced. An inclination angle of the end face of the connecting portion between the second cladding layer 152 and the third cladding layer 153 with respect to the plane orthogonal to the traveling direction of light is preferably about 7° but is not limited to this.

Figure 7:
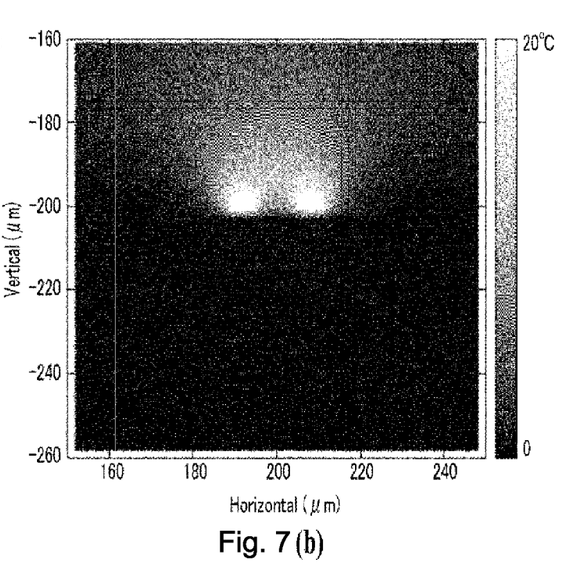
FIG. 7(a) shows a result of calculating a heat distribution in a case where SiC is used for a lower cladding and power of 50 μW/μm² is input to a heater unit.
FIG. 7(b) shows a result of calculating a heat distribution in a case where SiO₂ is used for a lower cladding and power of 50 μW/μm² is input to a heater unit.
Figure 8:
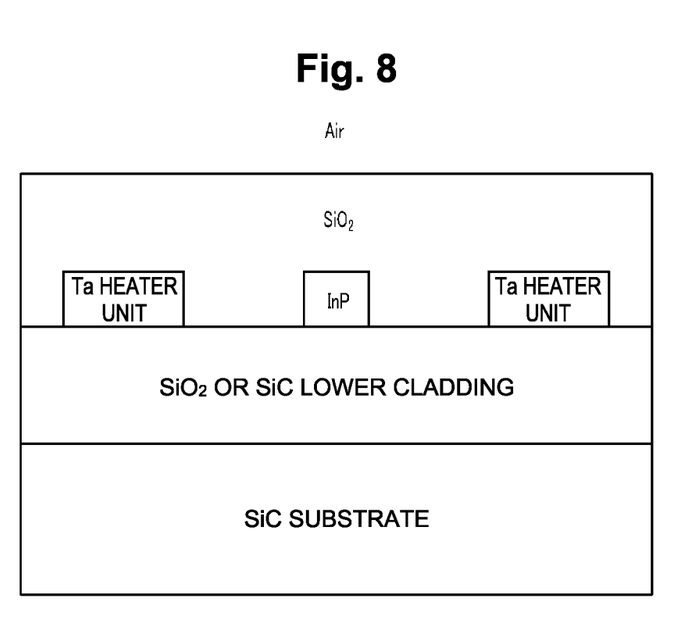
FIG. 8 is a cross-sectional view showing a layer structure around heater units which are arranged on two sides of a preceding-stage DBR unit in the semiconductor optical module according to the present embodiment or the reference example.

FIG. 7(a) shows a result of calculating a heat distribution in a case where SiC is used for a lower cladding and power of 50 µW/µm$^2$ is input to a heater unit, and FIG. 7(b) shows a result of calculating a heat distribution in a case where $SiO_2$ is used for a lower cladding and power of 50 µW/µm$^2$ is input to a heater unit. FIG. 8 is a cross-sectional view showing a layer structure around heater units arranged on two sides of a preceding-stage DBR unit in the semiconductor optical module according to the present example or the reference example.

The results shown in FIGS. 7(a) and 7(b) were calculated using the layer structure shown in FIG. 8. More specifically, the results were calculated by setting widths of the heater units at 5 µm and a distance between each heater unit and a core layer at 5 µm, as shown in FIG. 8. Ta was used as a material for the heater units.

If a lower cladding is made of SiC, a temperature increase in a region near each heater unit is less than 1° C., as shown in FIG. 7(a). In contrast, if the lower cladding is made of $SiO_2$, a temperature in a region near each heater unit increases by about 20° C., as shown in FIG. 7(b). Since thermal conductivity of $SiO_2$ is lower than that of SiC, the case where the lower cladding is made of $SiO_2$ clearly indicates an effect of efficiently generating heat in a waveguide region.

Figure 9:
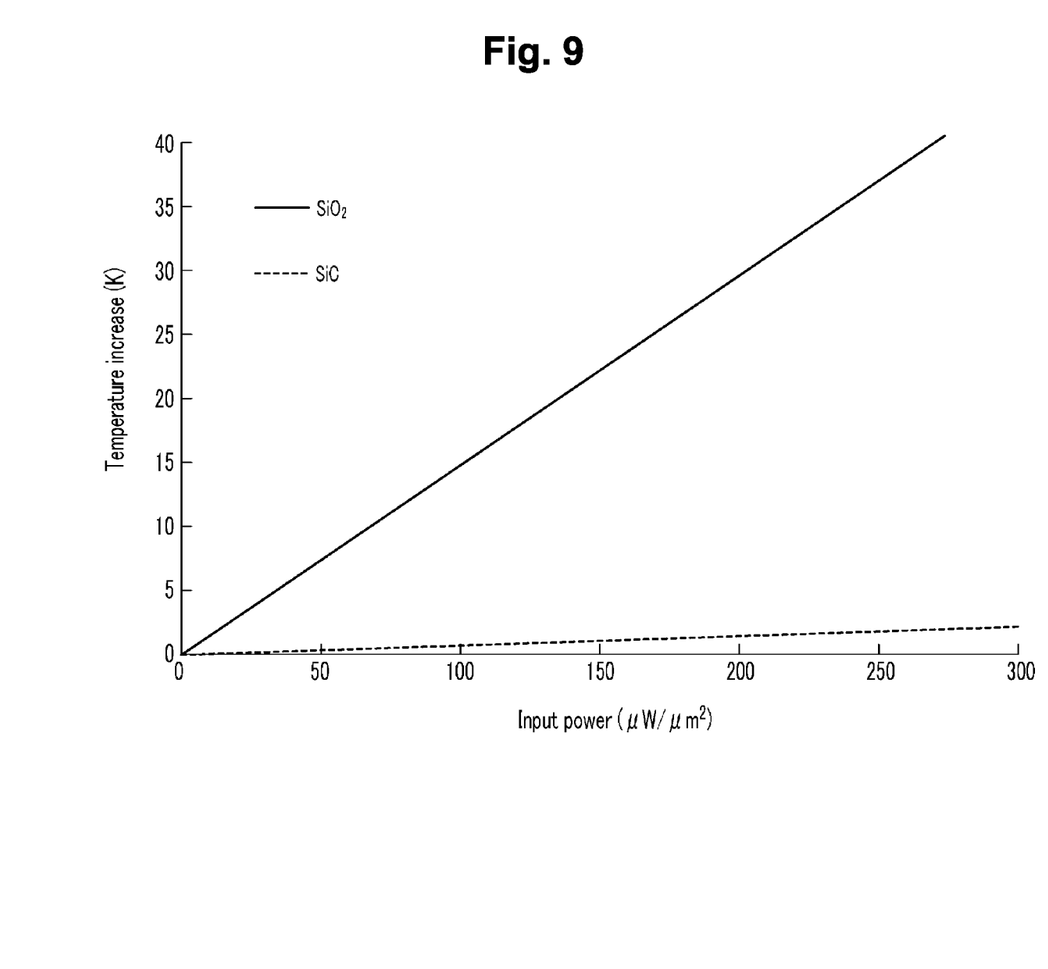
FIG. 9 shows a relationship of an increased temperature in a waveguide center portion to power supplied to a heater unit in each of a case where SiC is used for a lower cladding and a case where SiO₂ is used for a lower cladding.

FIG. 9 shows a relationship of an increased temperature in a waveguide center portion to power supplied to a heater unit in each of a case where SiC is used for a lower cladding and a case where $SiO_2$ is used for a lower cladding. The results shown in FIG. 9 were calculated using the layer structure shown in FIG. 8.

As shown in FIG. 9, power required to achieve a given temperature change in a case where $SiO_2$ is used for a lower cladding can be reduced to about one-twentieth that in a case where SiC is used for the lower cladding, which allows significant reduction in power consumption. Thus, adoption of a structure of the present invention allows reduction in power consumption required to achieve a desired temperature change. For this reason, efficient temperature adjustment of a DBR unit is possible, and a wavelength-variable laser which operates with low power consumption can be realized.

As described above, according to the present invention, it is possible to improve heat dissipation and improve properties of a semiconductor laser by using the second cladding layer 152 containing SiC or C as a lower cladding layer for the active layer 121. According to the present invention, it is possible to sufficiently couple laser light to the optical fiber 200 by using the third cladding layer 153 containing $SiO_2$ or the like as a lower cladding layer for the optical waveguide element region 110. Additionally, according to the present invention, it is possible to reduce power consumption required to achieve a desired temperature change by using the third cladding layer 153 containing $SiO_2$ or the like as a lower cladding layer for an optical waveguide which produces a temperature change in the heater units 125 and 126.

As has been described above, the semiconductor optical module according to the one embodiment of the present invention is capable of simultaneously achieving improvement in properties of a semiconductor laser, improvement in efficiency of coupling laser light to an optical fiber, and reduction in power consumption.

The invention claimed is:

1. A semiconductor optical module formed by integrating an optical waveguide element region and a semiconductor laser element region,
    wherein the semiconductor laser element region includes:
    an active layer, a first cladding layer which is formed such that the active layer is embedded in the first cladding layer, a second cladding layer which is formed underneath the active layer and the first cladding layer, and a heater unit which produces a temperature change in a waveguide in the semiconductor laser element region;
    the optical waveguide element region includes:
    a spot-size converter on which laser light emitted from the semiconductor laser element region is incident and which is composed of a tapered waveguide so as to convert a spot size of the incident laser light, and an optical waveguide core layer which is formed such that the spot-size converter is embedded in the optical waveguide core layer;
    the first cladding layer contains InP;
    the second cladding layer is made of a material lower in refractive index and higher in thermal conductivity than the first cladding layer; and
    a third cladding layer which is made of a material lower in refractive index and lower in thermal conductivity than the second cladding layer is formed underneath the spot-size converter and the heater unit.

2. The semiconductor optical module according to claim 1, wherein the second cladding layer contains SiC or C.

3. The semiconductor optical module according to claim 2, wherein the tapered waveguide of the spot-size converter contains InP.

4. The semiconductor optical module according to claim 2, wherein the third cladding layer contains any of SiN, SiO2, SiOx, SiON, or Al2O3.

5. The semiconductor optical module according to claim 2, further comprising
    a fourth cladding layer which is an upper cladding layer in the optical waveguide element region and the semiconductor laser element region, wherein
    the fourth cladding layer contains any of SiN, SiO2, SiOx, SiON, or Al2O3.

6. The semiconductor optical module according to claim 1, wherein the tapered waveguide of the spot-size converter contains InP.

7. The semiconductor optical module according to claim 6, wherein the third cladding layer contains any of SiN, SiO2, SiOx, SiON, or Al2O3.

8. The semiconductor optical module according to claim 6, further comprising
    a fourth cladding layer which is an upper cladding layer in the optical waveguide element region and the semiconductor laser element region, wherein
    the fourth cladding layer contains any of SiN, SiO2, SiOx, SiON, or Al2O3.

9. The semiconductor optical module according to claim 1, wherein the third cladding layer contains any of SiN, SiO2, SiOx, SiON, or Al2O3.

10. The semiconductor optical module according to claim 9, further comprising
    a fourth cladding layer which is an upper cladding layer in the optical waveguide element region and the semiconductor laser element region, wherein
    the fourth cladding layer contains any of SiN, SiO2, SiOx, SiON, or Al2O3.

11. The semiconductor optical module according to claim 1, further comprising:
    a fourth cladding layer which is an upper cladding layer in the optical waveguide element region and the semiconductor laser element region, wherein
    the fourth cladding layer contains any of SiN, SiO2, SiOx, SiON, or and Al2O3.

* * * * *